Sept. 11, 1956 R. A. HENLE 2,762,921

BINARY TRIGGER CIRCUIT

Filed Dec. 31, 1953

*INVENTOR.*
ROBERT A. HENLE
BY P. E. Henninger
ATTORNEY 2,762,921

BINARY TRIGGER CIRCUIT

Robert A. Henle, Hyde Park, N. Y., assignor to International Business Machines Corporation, New York, N. Y., a corporation of New York Application December 31, 1953, Serial No. 401,480

13 Claims. (Cl. 250—36)

This invention relates to binary trigger circuits and especially to binary trigger circuits employing transistors.

There have recently come into widespread use, for example, in high speed electrical computers, a class of circuits known as switching circuits, in which the current shifts suddenly between substantially separated values. A particular class of such switching circuits is known as trigger circuits. A trigger circuit may be defined as a switching circuit which has a single set of input terminals and is bistable, i. e. it has two stable values of output current and switches back and forth between its two stable output states in response to signal impulses applied to its input terminals. A trigger circuit is known as a binary trigger circuit if, in effect, it counts the input signal impulses in accordance with a binary system, i. e. it produces an output pulse in response to every other input pulse. In a true binary trigger circuit, all input pulses are of the same polarity.

It has been proposed to use transistors as translating elements in trigger circuits, in order to take advantage of the favorable characteristics of transistors with respect to power and voltage requirements. However, previous trigger circuits employing transistors have had tendencies toward instability due to variations in the characteristics of the transistors with time. Furthermore, since the characteristics of available transistors vary considerably from one transistor to another, it has been difficult to produce a transistor trigger circuit which works satisfactorily without careful adjustment of impedance values to suit the particular transistors used in it.

There is disclosed in the United States Patent No. 2,609,428 issued to Harold B. Law on September 2, 1952, a transistor having an asymmetrically conductive base electrode, in contrast to the more conventional transistors having an ohmic base electrode. Transistors of the type described by Law have high current amplification characteristics which make them very desirable for use in switching circuits generally.

An object of the present invention is to provide a binary trigger circuit employing transistors, which is reliable and stable in operation.

Another object is to provide an improved binary trigger circuit employing the type of transistor described in the Law patent mentioned above.

Another object is to provide a binary trigger circuit including a bistable circuit and a blocking oscillator interconnected so that the oscillator cuts off the bistable circuit on alternate input pulses.

Another object is to provide an improved bistable circuit employing a transistor of the type described by Law.

Another object is to provide an improved blocking oscillator circuit.

Another object is to provide an improved binary trigger circuit having dual outputs, one of which produces a step function output signal and the other of which produces a pulse output signal.

The foregoing and other objects of the invention are attained by providing: a bistable circuit including a transistor, a blocking oscillator circuit including another transistor, and cross connections between the output of each circuit and the input of the other so that when one becomes conductive it cuts the other off. Output terminals connected to the blocking oscillator circuit provide pulse type output signals, whereas output terminals connected to the bistable circuit provide step function output signals.

In one modification of the invention described herein, the bistable circuit employs a transistor of the type described by Law. The bistable operation is produced by a novel voltage divider feed-back circuit connecting the collector and emitter electrodes. Another modification of the invention employs a more conventional bistable transistor circuit.

The blocking oscillator circuit described herein employs an output transformer having three windings. One winding is connected in the collector circuit of a transistor, another is connected in a series feed-back circuit which extends to the emitter of the transistor, and a third provides output signals and signals for transmission to the input of the bistable circuit.

Other objects and advantages of the invention will become apparent from a consideration of the following specification and claims, taken together with the accompanying drawing.

FIGURE 1

Figures 1, 2, 3:
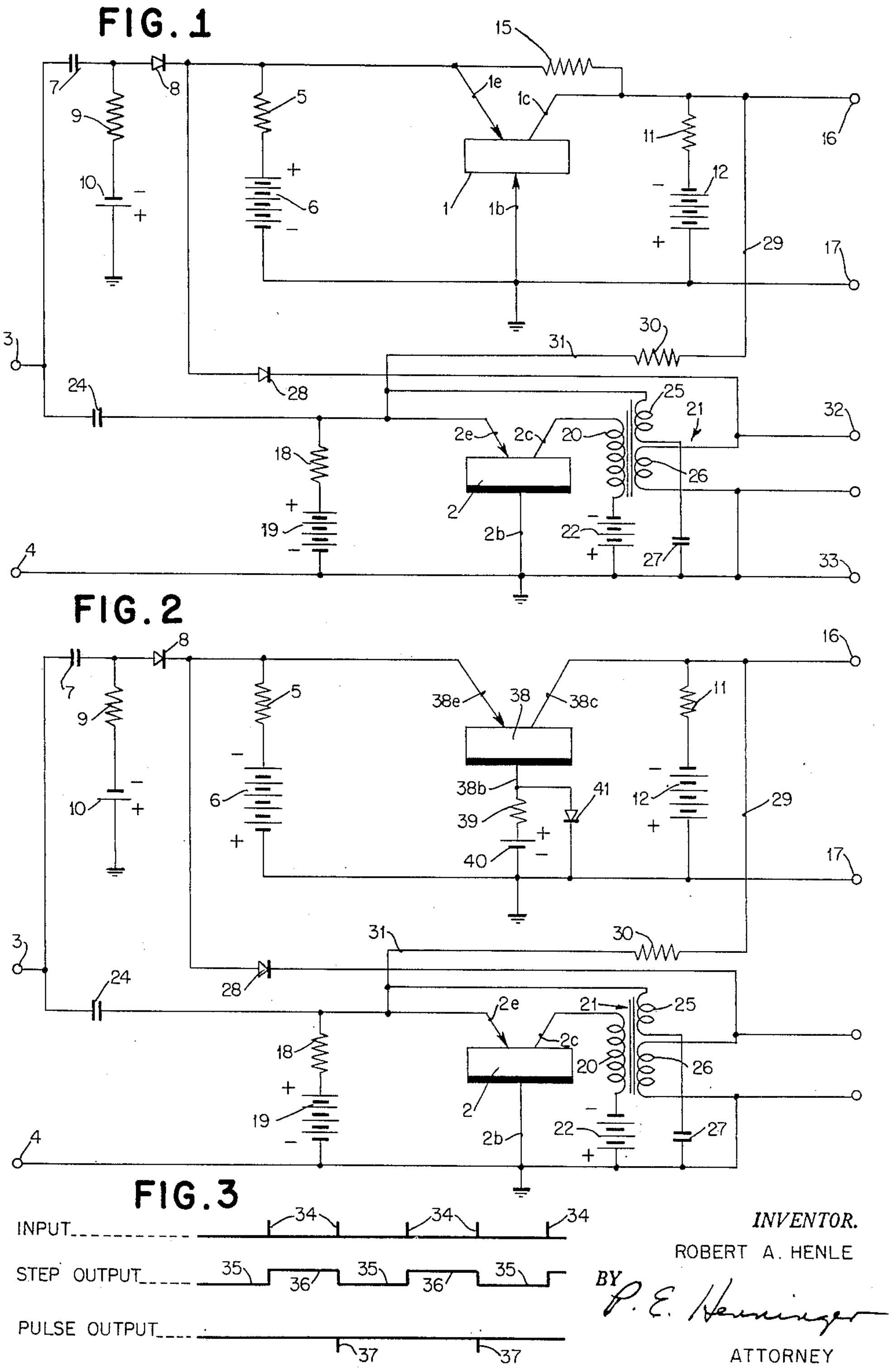
Figure 1 is a wiring diagram of a binary trigger circuit embodying the invention.
Figure 2 is a wiring diagram of a modified form of binary trigger circuit embodying the invention.
Figure 3 is a graphical illustration of input and output signals characteristic of the circuits illustrated.

There is shown in Figure 1 a circuit which includes a bistable circuit having a transistor 1 of the type described in the Law patent previously mentioned and a blocking oscillator circuit having a transistor 2, which may be a conventional point contact transistor.

The transistor 1 has a base electrode 1*b*, an emitter electrode 1*e* and a collector electrode 1*c*. Input signals are supplied to the bistable and blocking oscillator circuits through input terminals 3 and 4, the input terminal 4 being grounded.

Base electrode 1*b* is connected to ground. Emitter electrode 1*e* is connected to ground through a resistor 5 and a biasing battery 6. Input signals are transmitted from input terminal 3 to emitter electrode 1*e* through a connection which includes a capacitor 7 and an asymmetrical impedance element or diode 8 poled to pass positive input signals in its low impedance direction. The left hand terminal of the element 8, as it appears in the drawing, is connected to ground through a resistor 9 and a battery 10. The battery 10 is poled so as to provide a normal reverse bias for the asymmetrical element or diode 8.

The collector electrode 1*c* is connected to ground through a conventional load resistor 11 and a battery 12.

A feed-back connection is provided between collector 1*c* and emitter 1*e*, including a resistor 15.

Output terminals 16 and 17 are connected respectively to collector 1*c* and to ground.

The transistor 2 of the blocking oscillator circuit includes a base electrode 2*b*, an emitter electrode 2*e* and a collector electrode 2*c*. Base electrode 2*b* is connected directly to ground. Emitter electrode 2*e* is connected to ground through a resistor 18 and a battery 19. Collector electrode 2*c* is connected to ground through a primary winding 20 of a transformer 21 and a battery 22.

Input signals are transmitted from input terminal 3 through a capacitor 24 to emitter 2*e*.

The transformer 21 is provided with two secondary windings 25 and 26. Secondary winding 25 is connected in a series circuit with a capacitor 27 between the grounded base electrode 2*b* and the emitter 2*e*.

The secondary winding 26 is connected in series with an asymmetric impedance element or diode 28, between the grounded base 2*b* of the blocking oscillator circuit and the emitter 1*e* of the bistable circuit.

A gating connection including in series a wire 29, a resistor 30 and a wire 31 extends between collector electrode 1c of the bistable circuit and emitter electrode 2*e* of the blocking oscillator circuit.

Output terminals 32 and 33 are connected to the opposite ends of winding 26, the terminal 33 being connected to the grounded end.

OPERATION OF FIG. 1

Consider first the condition of the circuits when the bistable circuit is off, or in its low current output condition. At that time, the potential of collector 1c is substantially that of the negative terminal of battery 12, and is therefore substantially negative with respect to ground. The resistors 5 and 15 divide between them the potential drop between the positive terminal of battery 6 and the collector electrode 1c. At this time the total potential drop divided between these two resistors is such that the emitter electrode 1*e* is negative with respect to ground and the output of transistor 1 is therefore low, being substantially cut-off.

The high negative potential of collector 1c is transmitted through wire 29, resistor 30 and wire 31 to emitter 2*e*, where it is effective to bias that emitter substantially negatively with respect to ground, thereby holding the blocking oscillator cut-off.

The reverse bias on diode 8 is provided to keep it from acting as a load on the emitter 1*e*. Note that emitter 1*e* is normally negative with respect to ground because of the negative feed-back in the transistor, due to its asymmetric base 1*b*. Consequently, it is necessary to have diode 8 biased negatively to keep it from loading the emitter. This negative bias is effective at all times except when a positive signal pulse is applied to the input terminals 3 and 4.

The normally negative potential on emitter 1*e* provides an effective reverse bias for diode 28, so that it loads the emitter only when a positive signal is being received at the input, and when a cut-off potential is applied through it, as described below.

Under these conditions, assume that a positive input pulse is applied to input terminal 3. This pulse is transmitted through capacitor 7 and diode 8 to emitter 1*e*, where it becomes effective to shift the transistor 1 to its high output condition. The resulting increase in current flowing through the collector 1c makes the collector potential more positive, due to the increased potential drop through resistor 11. The resistors 5 and 15 are so proportioned that this change in the collector potential is reflected at the emitter 1*e*, making the emitter positive and latching the transistor in its on condition.

The effect of the feed-back through resistor 15 is to make the potential of emitter 1*e* more positive than it otherwise would be, for a given value of emitter current. However, due to the substantially increased emitter current in the on condition, the emitter potential with respect to ground may in some cases be more negative in the on condition than in the off condition, depending upon the emitter input characteristics of the particular transistor involved.

In the blocking oscillator circuit, the voltage dividing action between the positive terminal of battery 19 and collector 1c, through resistors 18 and 30, is such that when the bistable circuit is cut off, the positive input pulse received through input terminal 3 is not sufficient to overcome the negative bias provided by the voltage divider, and the oscillator circuit therefore remains off.

However, when the bistable circuit transfers to its on condition, the emitter 2*e* is made more positive, following the change in potential of collector electrode 1c. The emitter 2*e* is now at a potential which is only slightly negative, so that the next positive impulse signal received at input terminal 3 will make the emitter 2*e* go positive, thereby turning the transistor 2 on. When the transistor 2 sends a current through the primary winding 20 of transformer 21, the secondary winding 25 produces a positive feed-back impulse which greatly increases the magnitude of the current impulse in primary winding 20. The response of the blocking oscillator circuit to an input signal is a momentary current pulse of large magnitude. This momentary output pulse of the blocking oscillator is transmitted by winding 26 through diode 28 to the emitter electrode 1*e* of transistor 1. The polarity of winding 26 is such that this pulse applied to emitter 1*e* is highly negative, and is effective to cut off the transistor 1, thereby transferring it to its low output state, in which it is latched by the action of the feed-back resistance 15.

Referring to Figure 3, it may be seen that a series of spaced input signal pulses 34 will alternately shift the bistable circuit from its low output state illustrated at 35, to its high output state, illustrated at 36, and back again. At the same time, there will be produced at the output terminals 32 and 33 a series of binary pulses 37 each of which counts two of the input pulses 34.

The following table shows, by way of example, a particular set of values for the potentials of the various batteries and for the impedances of the various resistors, in a circuit which has been operated successfully. It will be understood that these values are set forth by way of example only, and that the invention is not limited to these values or any of them. No values are given for the asymmetric impedance elements, which may be considered to have substantially zero impedance in their forward direction and substantially infinite impedance in their reverse direction.

*Table I*

| | | |
|---|---|---|
| Resistor 5 | ohms | 43,000 |
| Battery 6 | volts | 90 |
| Capacitor 7 | mfd | 220 |
| Resistor 9 | ohms | 3,000 |
| Battery 10 | volts | 5 |
| Resistor 11 | ohms | 1,200 |
| Battery 12 | volts | 15 |
| Battery 14 | do | 15 |
| Resistor 15 | ohms | 5,600 |
| Resistor 18 | do | 75,000 |
| Battery 19 | volts | 90 |
| Transformer winding 20 | turns | 40 |
| Battery 22 | volts | 15 |
| Capacitor 24 | mfd | 220 |
| Transformer winding 25 | turns | 10 |
| Transformer winding 26 | do | 80 |
| Capacitor 27 | mmf | 680 |
| Resistor 30 | ohms | 2,700 |

FIGURE 2

The circuit illustrated in Figure 2 is similar to that of Figure 1, except that a conventional point contact transistor 38 is used in place of the transistor 1 of Figure 1.

Corresponding modifications are made in the bistable circuit of the transistor 38.

In the circuit of Figure 2, those elements which correspond to their counterparts in Figure 1 have been given the same reference numerals, and will not be further described. The correspondence between such counterparts is reasonably close, except that in the circuit of Fig. 2, resistor 5 should have a resistance of 2,000 ohms and battery 6 should have a potential of 3 volts.

Transistor 38 is provided with an emitter electrode 38*e*, a collector electrode 38*c* and a base electrode 38*b*. The positive feed-back connection required for bistable operation is supplied in the case of transistor 38 by a resistor 39 and a battery 40 connected in series between the base 38b and ground. An asymmetric impedance element or diode 41 by-passes the resistor 39 and battery 40. This type of feed-back connection is conventional in circuits employing transistors of the type described, and it is believed unnecessary to describe it further here.

The operation of the circuit of Figure 2 is analogous to that of the circuit of Figure 1. A detailed description of it would be repetitious, and it is therefore omitted.

While I have shown and described certain preferred embodiments of my invention, other modifications thereof will readily occur to those more skilled in the art, and I therefore intend my invention to be limited only by the appended claims.

I claim:

1. A binary trigger circuit, comprising a bistable circuit including an input circuit branch, an output circuit branch, positive feed-back means connecting said output and input branches, and means effective upon receipt of a signal of predetermined polarity at said input branch to shift said output branch from a low output state to a high output state; a blocking oscillator circuit including an input circuit branch, an output circuit branch, and oscillatory feed-back means connecting said oscillator output and input branches, and effective upon receipt of an input signal of said predetermined polarity to limit the oscillator response to a single output pulse; means coupling incoming input signals of said polarity to both said input circuits, a gating connection between the bistable circuit output and the oscillator input to hold the oscillator off when the bistable circuit is in its low output state, and a connection between the oscillator output and the bistable circuit input and effective when the oscillator transmits a signal pulse to return the bistable circuit to its low output state.

2. A binary trigger circuit as defined in claim 1, including binary step signal output terminals connected to the output circuit branch of said bistable circuit.

3. A binary trigger circuit as defined in claim 1, including binary pulse signal output terminals connected to the output circuit branch of the oscillator circuit.

4. A binary trigger circuit, comprising a bistable circuit including a transistor having a semi-conductive body, a base electrode, an emitter electrode, and a collector electrode, an input circuit branch for said bistable circuit including two of said electrodes, an output circuit branch for said bistable circuit including one of said two electrodes and the third electrode, and positive feed-back means connecting said output and input branches, said bistable circuit being effective upon receipt of a signal of predetermined polarity at said input branch to shift from a low output state to a high output state; a blocking oscillator circuit including a transistor having a semi-conductive body, a base electrode, an emitter electrode and a collector electrode, an input circuit branch for said oscillator circuit including two of said electrodes, an output circuit branch for said oscillator circuit including one of said two electrodes and the third electrode, and oscillatory feed-back means connecting said oscillator output and input branches, and effective upon receipt of an input signal of said predetermined polarity to limit the oscillator response to a single output pulse; means coupling incoming input signals of said polarity to both said input circuits, a gating connection between the bistable circuit output and the oscillator input to hold he oscillator off when the bistable circuit is in its low output state, and a connection between the oscillator output and the bistable circuit input and effective when the oscillator transmits a signal pulse to supply to the input branch a signal pulse of polarity opposite to said predetermined polarity and thereby return the bistable circuit to its low output state.

5. A binary trigger circuit as defined in claim 4, in which said gating connection comprises a resistor connected between the third electrode of said bistable circuit and the electrode in said oscillator input circuit branch which is not in the output circuit branch.

6. A binary trigger circuit as defined in claim 4, in which the oscillatory feed-back means comprises a transformer having a primary winding connected in the oscillator output circuit branch and a secondary winding connected to the two input electrodes of the oscillator circuit; and said connection between the oscillator output and the bistable circuit input comprises a second secondary winding on said transformer, an asymmetric impedance unit, and a circuit branch connecting said secondary winding in series with said asymmetric impedance unit to the input circuit branch of the bistable circuit.

7. A binary trigger circuit as defined in claim 4, in which said coupling means comprises a capacitor, an asymmetric impedance unit connected in series between said capacitor and said input circuit branch of the trigger circuit and pulsed to pass input signals of said predetermined polarity, and means biasing said asymmetric impedance unit reversely.

8. A binary trigger circuit as defined in claim 4, in which the bistable circuit transistor includes asymmetrically conductive base, emitter and collector electrodes; said bistable circuit input circuit branch includes said emitter and base electrodes, and the bistable circuit output circuit branch includes said collector and base electrodes.

9. A binary trigger circuit comprising, a first bistable transistor system having input and output circuits and responsive to a potential of one polarity in said input circuit for establishing a stable high-output operating condition and to a potential of opposite polarity in said input circuit for establishing a stable low-output operating condition of said system, a second transistor system having input and output circuits with transient feed-back coupling therebetween to develop an output pulse in response to an applied input-circuit potential of said one polarity, means including a direct-current coupling circuit for controlling the operation of said second system by the output of said first system and including an alternating-current coupling circuit for controlling the operation of said first system by the output of said second system, and means for applying input pulses of said one polarity concurrently to the input circuits of said first and second systems.

10. A binary trigger circuit comprising, a first bistable transistor system having input and output circuits and responsive to a positive polarity potential in said input circuit for establishing a stable high-output operating condition and responsive to a negative polarity potential in said input circuit for establishing a stable low-output operating condition of said system, a transistor system having input and output circuits with transient feed-back coupling therebetween to develop an output pulse in response to an applied input circuit potential of positive polarity, means including a direct current coupling circuit for controlling the operation of said second system by the output of said first system and including an alternating current coupling circuit for controlling the operation of said first system by the output of said second system, and means for applying positive polarity pulses concurrently to the input circuits of said first and second systems.

11. A binary trigger circuit comprising, a first bistable transistor system having input and output circuits and responsive to a potential of one polarity in said input circuit for establishing a stable high-output operating condition and to a potential of opposite polarity in said input circuit for establishing a stable low-output operating condition of said system, a second transistor system having input and output circuits with transient feed-back coupling therebetween to develop an output pulse in response to an applied input-circuit potential of said one polarity, means including a direct-current coupling circuit for controlling an operating bias of said second system by the output potentials of said first system and including an alternating-current coupling circuit for applying pulses developed by said second system to said input circuit of said first system, and means for applying input pulses of said one polarity concurrently to the input circuits of said first and second systems.

12. A binary trigger circuit comprising, a first bistable transistor system having input and output circuits and responsive to a positive polarity potential in said input circuit for establishing a stable high-output operating condition and responsive to a negative polarity potential in said input circuit for establishing a stable low-output operating condition of said system, a blocking-oscillator transistor system for developing negative polarity output pulses in response to positive polarity pulses applied to an input circuit thereof, means including a direct-current coupling circuit for controlling an operating bias of said second system by the output potentials of said first system and including an alternating-current coupling circuit for applying pulses developed by said second system to said input circuit of said first system, and means for applying input pulses of said one polarity concurrently to the input circuits of said first and second systems.

13. A binary trigger circuit comprising, a first bistable transistor system having input and output circuits and responsive to a positive polarity potential in said input circuit for establishing a stable high-output operating condition and responsive to a negative polarity potential in said input circuit for establishing a stable low-output operating condition of said system, polarity inverting means having input and output circuits for inverting positive polarity pulses applied to the input circuit thereof to negative polarity pulses in said output circuit thereof, means responsive to the operation of said first system for maintaining said inverter means deactivated during the low-output operating condition of said first system and conditioned for operation during the high-output operating condition of said first system, means for applying inverted polarity pulses from said output circuit of said inverting means to said input circuit of said first system, and means for applying positive polarity pulses concurrently to the input circuits of said first system and said polarity inverting means.

References Cited in the file of this patent

UNITED STATES PATENTS

| | | |
|---|---|---|
| 2,452,549 | Cleeton | Nov. 2, 1948 |
| 2,533,001 | Eberhard | Dec. 5, 1950 |
| 2,599,266 | Lester | June 3, 1952 |
| 2,619,632 | Krumhansl et al. | Nov. 25, 1952 |
| 2,622,212 | Anderson et al. | Dec. 16, 1952 |
| 2,676,251 | Scarbrough | Apr. 20, 1954 |

OTHER REFERENCES

Article: "Junction Transistor Circuit Applications," by Sulzer, from Electronics for August 1953, page 173 and Fig. 6D; 307–88.5 Lit.